US012534820B2

(12) United States Patent
Kawakami et al.

(10) Patent No.: US 12,534,820 B2
(45) Date of Patent: Jan. 27, 2026

(54) METHOD FOR GROWING SILICON SINGLE CRYSTAL

(71) Applicant: SUMCO CORPORATION, Tokyo (JP)

(72) Inventors: Yasufumi Kawakami, Nagasaki (JP); Kazuyoshi Sakatani, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 283 days.

(21) Appl. No.: 18/030,000

(22) PCT Filed: Jul. 30, 2021

(86) PCT No.: PCT/JP2021/028301
§ 371 (c)(1),
(2) Date: Apr. 3, 2023

(87) PCT Pub. No.: WO2022/074908
PCT Pub. Date: Apr. 14, 2022

(65) Prior Publication Data
US 2024/0003049 A1 Jan. 4, 2024

(30) Foreign Application Priority Data
Oct. 9, 2020 (JP) ................................ 2020-170959

(51) Int. Cl.
*C30B 15/22* (2006.01)
*C30B 15/04* (2006.01)
*C30B 29/06* (2006.01)

(52) U.S. Cl.
CPC .............. *C30B 15/22* (2013.01); *C30B 15/04* (2013.01); *C30B 29/06* (2013.01)

(58) Field of Classification Search
CPC .......... C30B 15/04; C30B 15/22; C30B 29/06
See application file for complete search history.

(56) References Cited

U.S. PATENT DOCUMENTS

2004/0211359 A1* 10/2004 Shiraishi ................ C30B 29/06 117/208
2007/0068448 A1 3/2007 Shiraishi et al.
(Continued)

FOREIGN PATENT DOCUMENTS

DE 112018002156 T5 1/2020
JP H05-221777 A 8/1993
(Continued)

OTHER PUBLICATIONS

Office Action in DE Patent Application No. 112021005334.5, Oct. 9, 2024, translation.
(Continued)

*Primary Examiner* — Hua Qi
(74) *Attorney, Agent, or Firm* — GREENBLUM & BERNSTEIN, P.L.C.

(57) ABSTRACT

A method of growing monocrystalline silicon through a Czochralski process uses a monocrystalline silicon growth device, the device including: a chamber; a crucible; a heater configured to heat a silicon melt contained in the crucible, in which the heater includes: an upper heater configured to heat an upper portion of the crucible; and a lower heater configured to heat a lower portion of the crucible; and a pull-up unit configured to pull up a seed crystal after bringing the seed crystal into contact with the silicon melt. The method includes: adding a volatile dopant to the silicon melt; and subsequently to the step, pulling up the monocrystalline silicon. In the step, the crucible is heated in a manner that no solidified layer is formed on a liquid surface of the silicon melt and heat generation amounts Qd, Qu of the lower heater and the upper heater satisfy Qd>Qu.

7 Claims, 5 Drawing Sheets

(56) References Cited

U.S. PATENT DOCUMENTS

| | | | | |
|---|---|---|---|---|
| 2007/0227439 | A1 | 10/2007 | Yokoyama et al. | |
| 2018/0094360 | A1* | 4/2018 | Narushima | C30B 15/30 |
| 2018/0291524 | A1* | 10/2018 | Basak | C30B 15/04 |
| 2019/0249331 | A1* | 8/2019 | Narushima | C30B 15/20 |
| 2020/0141024 | A1* | 5/2020 | Maegawa | C30B 35/007 |

FOREIGN PATENT DOCUMENTS

| | | | | | |
|---|---|---|---|---|---|
| JP | 2007-261846 | A | | 10/2007 | |
| JP | 2011-73897 | A | | 4/2011 | |
| JP | 2012-1408 | A | | 1/2012 | |
| JP | 2016-183071 | A | | 10/2016 | |
| JP | 2017-222551 | A | | 12/2017 | |
| WO | 2003/029533 | A1 | | 4/2003 | |
| WO | WO-2018198606 | A1 | * | 11/2018 | C30B 15/04 |
| WO | 2019/003968 | A1 | | 1/2019 | |

OTHER PUBLICATIONS

IPRP issued in International Patent Application No. PCT/JP2021/028301, Mar. 28, 2023, translation.

International Search Report issued in WIPO Patent Application No. PCT/JP2021/028301, dated Sep. 7, 2021, along with an English translation thereof.

Writtent Opinion issued in WIPO Patent Application No. PCT/JP2021/028301, dated Sep. 7, 2021.

* cited by examiner

METHOD FOR GROWING SILICON SINGLE CRYSTAL

TECHNICAL FIELD

The present invention relates to a method of growing monocrystalline silicon.

BACKGROUND ART

There has been conventionally known a method of growing monocrystalline silicon with a low resistivity using a Czochralski method (hereinafter abbreviated as a "CZ method") by adding, at a high concentration, a volatile dopant such as phosphorus (P), arsenic (As) or antimony (Sb) to a silicon melt (see, for instance, Patent Literature 1).

After a silicon material is melted into the silicon melt, the volatile dopant is made to be absorbed through a liquid surface of the silicon melt. Since the volatile dopant begins to evaporate immediately after the doping operation and continuously evaporates, a supply amount of the volatile dopant is determined by including an evaporation amount.

A large evaporation amount of the volatile dopant, for instance, deteriorates a probability of obtaining a target resistivity of the monocrystalline silicon and thus attempts to reduce the evaporation of the volatile dopant have been made. As a method of reducing the evaporation of the volatile dopant, a method of increasing pressure in a chamber is known. This is an attempt to reduce the volatile dopant that evaporates from the liquid surface of the silicon melt by increasing pressure applied to the liquid surface.

Patent Literature 2 describes a method of reducing the evaporation of the volatile dopant by forming a solidified layer on the liquid surface of the silicon melt.

CITATION LIST

Patent Literature(s)

Patent Literature 1: JP 2012-1408 A
Patent Literature 2: JP 2011-73897 A

SUMMARY OF THE INVENTION

Problem(s) to be Solved by the Invention

However, at high pressure in the chamber, an evaporated substance (e.g., SiOx) from the silicon melt adheres to an inner wall of the chamber or the like and falls during pulling up of the monocrystalline silicon, so that the fallen substance causes dislocations.

Further, the method described in Patent Literature 2 has difficulty in controlling a region on the liquid surface of the silicon melt, where the solidified layer is formed.

This problem is specifically described below. In the method described in Patent Literature 2, doping is performed by gasifying a dopant in the dopant supply unit, which is hung by a wire, to generate a dopant gas and directly injecting the dopant gas into a surface of the silicon melt. When this method is used particularly in a pull-up furnace including a heat shield, the dopant gas is injected into a central region of the surface of the silicon melt.

It is thus necessary that no solidified layer should be formed on the central region of the surface of the silicon melt that is distant from a heater and a solidified layer should be formed on an outer peripheral region of the surface of the silicon melt that is close to the heater. However, a structure of the pull-up furnace provides such a temperature distribution on the surface of the silicon melt that a liquid temperature on the outer peripheral region close to the heater is high and a liquid temperature on the central region distant from the heater is low. Thus, it is highly difficult to form the solidified layer on the outer peripheral region of the surface of the silicon melt, which is close to the heater and thus has a high liquid temperature, while no solidified layer is formed on the central region which has a low liquid temperature.

An object of the invention is to provide a method of growing monocrystalline silicon, the method capable of reducing evaporation of a volatile dopant while inhibiting occurrence of dislocations.

Means for Solving the Problem(s)

In dedicated studies to reduce evaporation of a volatile dopant, the inventors have found that the evaporation of the volatile dopant can be reduced by heating a lower portion of a crucible more than an upper portion thereof to reduce a temperature of a liquid surface of a silicon melt without forming a solidified layer on the liquid surface. Specifically, it has been found that, by heating the crucible so that a heat generation amount Qu (output) of an upper heater forming the heater and a heat generation amount Qd of a lower heater forming the heater satisfy Qd>Qu, an evaporation rate of the volatile dopant can be reduced.

FIG. 1 shows results of the experiment. In FIG. 1, an abscissa axis represents a heat generation ratio Qd/Qu, which is obtained by dividing the heat generation amount Qd of the lower heater by the heat generation amount Qu of the upper heater, and an ordinate axis represents an evaporation rate (g/h) of the volatile dopant. Through the experiment, it has been found that, by setting the heat generation ratio Qd/Qu to approximately 3.5, the evaporation rate of the volatile dopant can be reduced to 57.3% and an added amount of the volatile dopant can be reduced by as compared with a case where the heat generation ratio Qd/Qu is approximately 1.

According to an aspect of the invention, a method of growing monocrystalline silicon according to a Czochralski process using a monocrystalline silicon growth device, the device including: a chamber; a crucible disposed in the chamber; a heater configured to heat a silicon melt contained in the crucible, the heater including an upper heater configured to heat an upper portion of the crucible and a lower heater configured to heat a lower portion of the crucible; and a pull-up unit configured to pull up a seed crystal after bringing the seed crystal into contact with the silicon melt, the method includes: adding a volatile dopant to the silicon melt; subsequently to the adding of the volatile dopant, pulling up the monocrystalline silicon, in which in the adding of the volatile dopant, the crucible is heated in a manner that no solidified layer is formed on a liquid surface of the silicon melt and a heat generation amount Qd of the lower heater and a heat generation amount Qu of the upper heater satisfy Qd>Qu.

In the above method of growing monocrystalline silicon, the volatile dopant may be red phosphorus, arsenic, or antimony.

In the above method of growing monocrystalline silicon, in the adding of the volatile dopant, the crucible may be heated in a manner that a heat generation ratio Qd/Qu is in a range from 1.5 to 4.0, the heat generation ratio Qd/Qu being obtained by dividing the heat generation amount Qd of the lower heater by the heat generation amount Qu of the upper heater.

In the above method of growing monocrystalline silicon, the pulling up of the monocrystalline silicon may include growing a neck, and a heat generation ratio Qd/Qu in the growing of the neck may be 100±10% of the heat generation ratio Qd/Qu in the adding of the volatile dopant.

In the above method of growing monocrystalline silicon, the pulling up of the monocrystalline silicon may include growing a shoulder, in a case where a target oxygen concentration in a straight body is $12.0\times10^{17}$ atoms/$cm^3$ or more, a heat generation ratio Qd/Qu at least at completion of the growing of the shoulder may be in a range from 3.5 to 4.5, and in a case where the target oxygen concentration in the straight body is less than $12.0\times10^{17}$ atoms/$cm^3$, the heat generation ratio Qd/Qu at least at the completion of the growing of the shoulder may be in a range from 0.75 to 1.25.

The above method of growing monocrystalline silicon further may include, in or after the growing of the shoulder, determining first whether a dislocation occurs in the shoulder, in which in a case where it is determined that the dislocation occurs in the shoulder in the first determining of whether the dislocation occurs, the pull-up operation may be stopped and melting the monocrystalline silicon into the silicon melt may be executed, and a heat generation ratio Qd/Qu in the melting of the monocrystalline silicon may be in a range from 1.5 to 3.0.

The above method of growing monocrystalline silicon further may include, subsequently to the pulling up of the monocrystalline silicon, pulling up another or more pieces of monocrystalline silicon using the crucible unchanged, in which prior to the pulling up of the another or more pieces of monocrystalline silicon, the volatile dopant may be added to a silicon melt for the another or more pieces of monocrystalline silicon, and in the adding of the volatile dopant, the crucible may be heated in a manner that the heat generation ratio Qd/Qu is in a range from 1.5 to 4.0.

According to the above aspect of the invention, evaporation of the volatile dopant can be reduced while occurrence of dislocations can be inhibited. Further, according to the above aspect of the invention, an evaporation amount of the volatile dopant is less varied, so that a probability of obtaining a target resistivity of a product can be increased.

Furthermore, by heating the crucible in a manner that no solidified layer is formed on the liquid surface of the silicon melt, doping can be more reliably performed without being hindered by the solidified layer.

BRIEF DESCRIPTION OF DRAWING(S)

FIG. 1 shows results of an experiment of determining an effect of a change in heat generation ratio on an evaporation rate.

FIG. 2 schematically shows an example of a structure of a monocrystalline silicon growth device used in a method of growing monocrystalline silicon according to an exemplary embodiment of the invention.

FIG. 3 schematically shows an example of a structure of a dopant supply unit of the monocrystalline silicon growth device of the exemplary embodiment of the invention.

DESCRIPTION OF EMBODIMENT(S)

A preferred exemplary embodiment of the invention is described below in detail with reference to the attached drawings.

A method of growing monocrystalline silicon according to the invention is characterized by, in growing monocrystalline silicon using a volatile dopant, reducing a temperature of a liquid surface of a silicon melt to reduce an evaporation rate of the volatile dopant. Further, the method of growing monocrystalline silicon according to the invention is suitable for doping the silicon melt by directly injecting a gasified volatile dopant into a central portion of the liquid surface of the silicon melt.

Monocrystalline Silicon Growth Device

Figure 1:
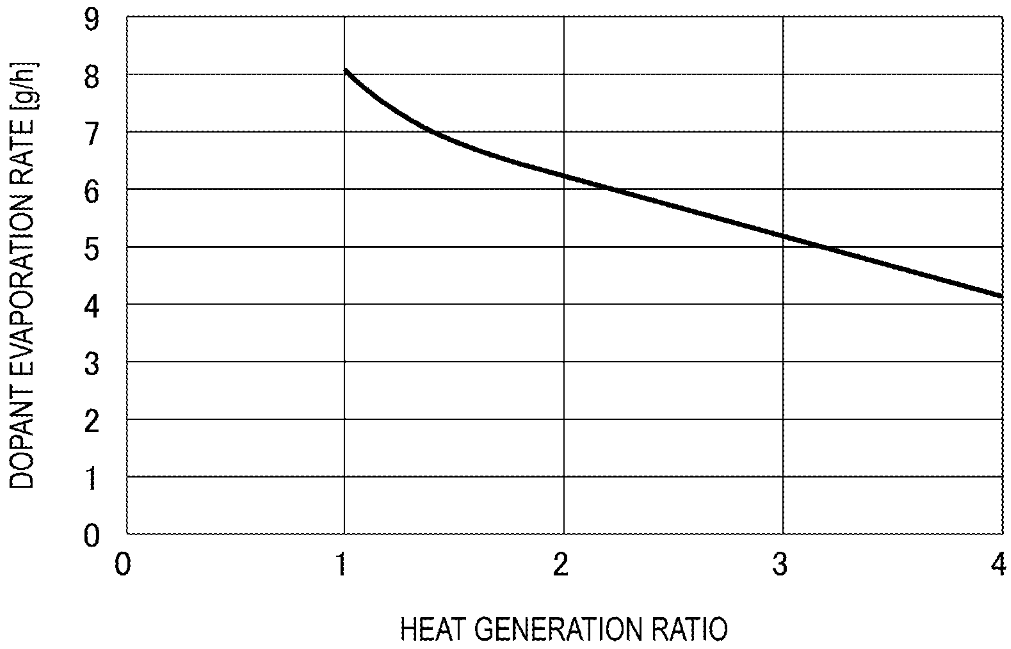
Figure 2:
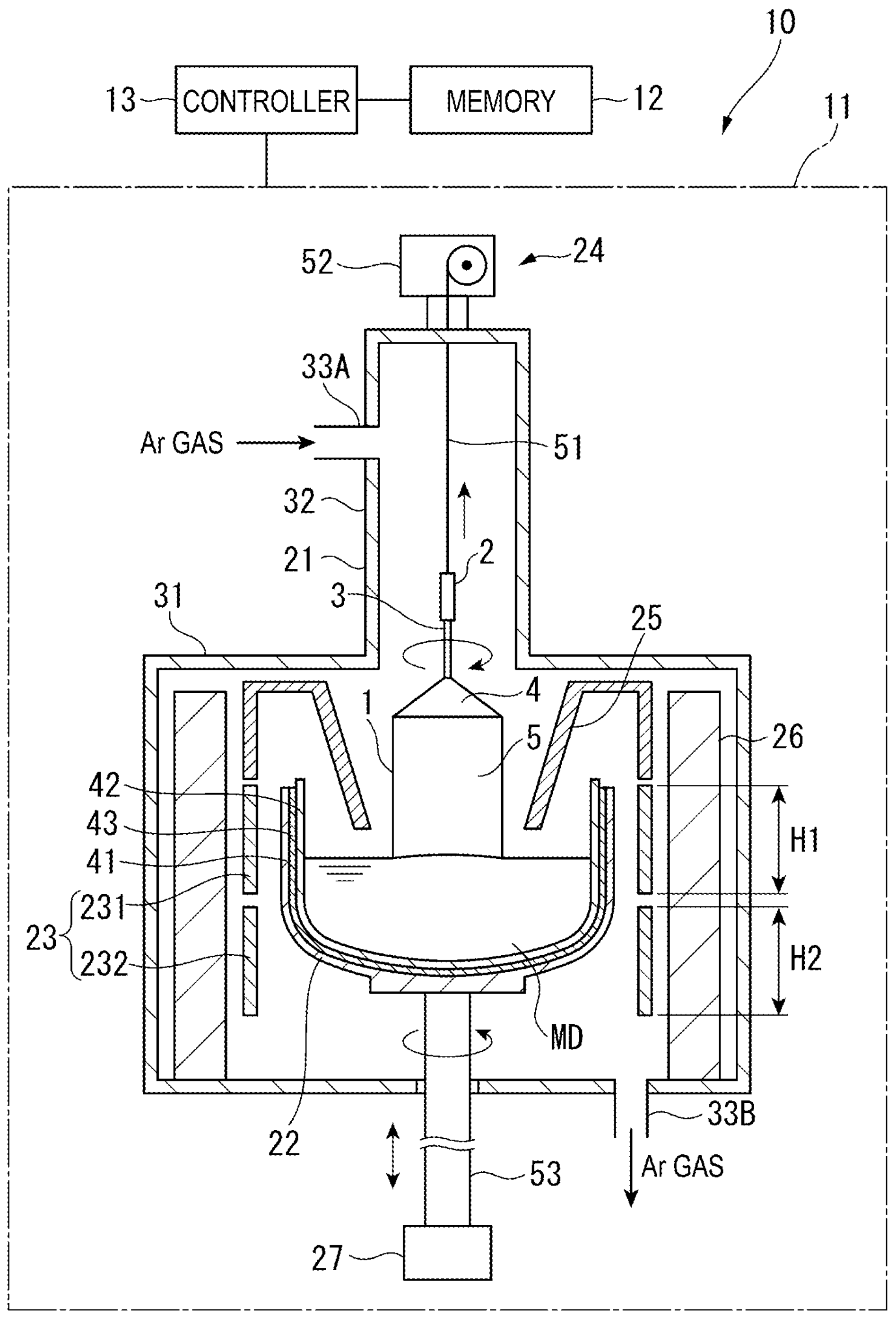

FIG. 2 schematically shows an example of a structure of a monocrystalline silicon growth device 10 used in the method of growing monocrystalline silicon according to the exemplary embodiment of the invention. The monocrystalline silicon growth device 10 grows monocrystalline silicon 1 by the CZ method.

As shown in FIG. 2, the monocrystalline silicon growth device 10 includes a device body 11, a memory 12, and a controller 13. The device body 11 includes a chamber 21, a crucible 22, a heater 23, a pull-up unit 24, a heat shield 25, a heat insulation material 26, and a crucible driver 27.

Figure 3:
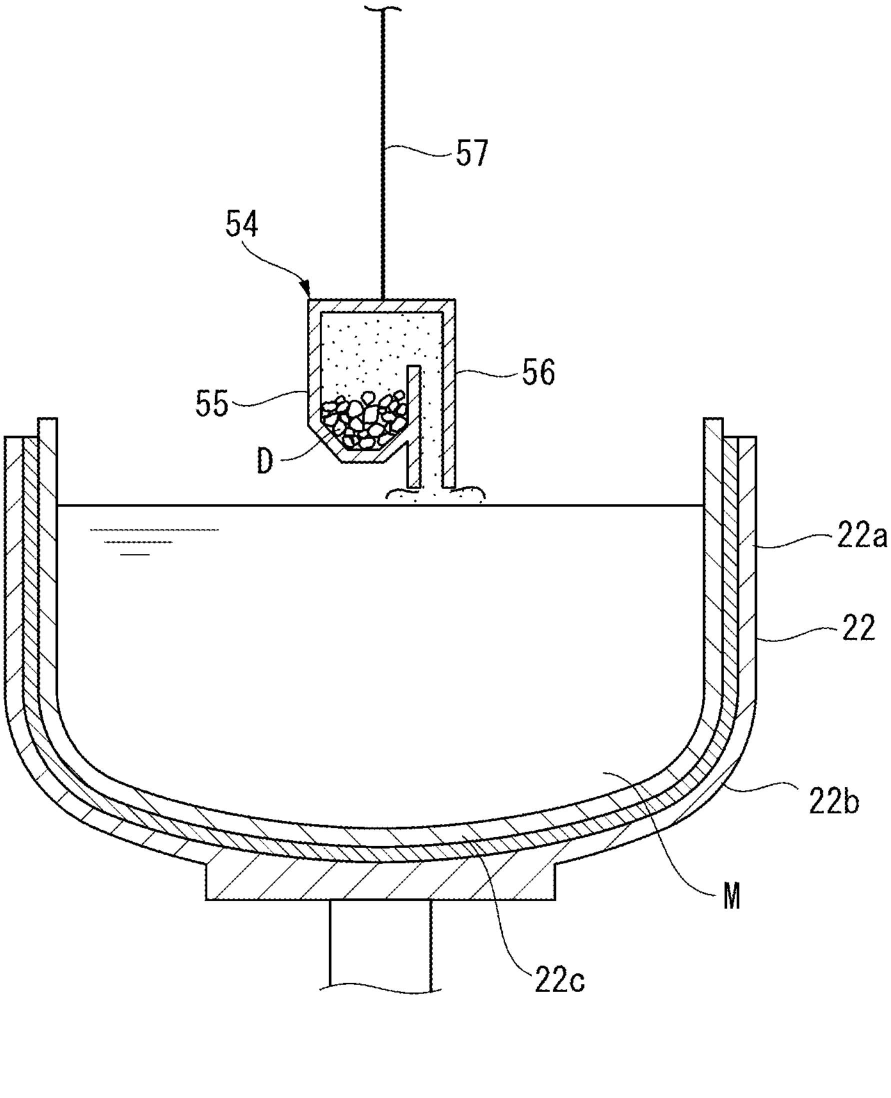

As shown in FIG. 3, the monocrystalline silicon growth device 10 includes a dopant supply unit 54. The dopant supply unit 54 includes: a container body 55 in which a volatile dopant D is contained; a release tube 56 provided to the container body 55 in a manner to extend downward with an open lower end; and a support wire 57 supporting the container body 55 so that the container body is vertically movable.

As shown in FIG. 2, the chamber 21 includes a main chamber 31 and a pull chamber 32 connected to an upper portion of the main chamber 31. A gas inlet 33A through which an inert gas such as argon (Ar) gas is introduced into the chamber 21 is provided in an upper portion of the pull chamber 32. A gas outlet 33B through which gas in the chamber 21 is discharged by driving a vacuum pump (not shown) is provided in a lower portion of the main chamber 31.

An inert gas introduced into the chamber 21 through the gas inlet 33A flows downward between the monocrystalline silicon 1 being grown and the heat shield 25, flows through a space between a lower end of the heat shield 25 and a liquid surface of a dopant-added melt MD, then flows between the heat shield 25 and an inner wall of the crucible 22 and further toward an outside of the crucible 22, then flows downward along the outside of the crucible 22, and is discharged through the gas outlet 33B.

The crucible 22, which is disposed in the main chamber 31, stores the dopant-added melt MD. The crucible 22 is defined by a side portion 22*a*, a bottom portion 22*c*, and a curved portion 22*b* connecting the side portion 22*a* and the bottom portion 22*c* (see FIG. 3). The crucible 22 includes a support crucible 41, a quartz crucible 42 housed in the support crucible 41, and a graphite sheet 43 placed between the support crucible 41 and the quartz crucible 42. It should be noted that the graphite sheet 43 may not be provided.

The support crucible 41 is formed from, for instance, graphite or carbon fiber reinforced carbon. For instance, a surface of the support crucible 41 may be coated with silicon carbide (SiC) or pyrolytic carbon. The quartz crucible 42 contains silicon dioxide ($SiO_2$) as a main component. The graphite sheet 43 is formed from, for instance, exfoliated graphite.

The heater 23, which is disposed outside the crucible 22 at a predetermined distance therefrom, heats a silicon melt M (see FIG. 3) or the dopant-added melt MD in the crucible 22. The heater 23 includes: an upper heater 231 configured to heat an upper portion of the crucible 22; and a lower heater 232 disposed below the upper heater 231 and configured to heat a lower portion of the crucible 22.

The upper portion of the crucible 22, which is a target to be heated by the upper heater 231, includes at least the side portion 22*a* of the crucible 22, which is located at or around a liquid surface level of the silicon melt M.

The lower portion of the crucible 22, which is a target to be heated by the lower heater 232, includes at least the curved portion 22*b* or the bottom portion 22*c* of the crucible 22.

Provided that a height of the upper heater 231 is denoted by H1 and a height of the lower heater 232 is denoted by H2, the heater 23 is configured so that the height of the upper heater 231 and the height of the lower heater 232 satisfy H1:H2=1:1. Further, the upper heater 231 and the lower heater 232 are arranged as close as possible to each other.

The height H1 of the upper heater 231 and the height H2 of the lower heater 232 are not necessarily in the above ratio and, for instance, may satisfy H1:H2=2:3. An output of the upper heater 231 and an output of the lower heater 232 are proportional to the respective heights of the upper heater 231 and the lower heater 232. Thus, in a case of satisfying H1:H2=2:3, supplying the same amount of electric power to each of the upper heater 231 and the lower heater 232 results in an output ratio between the upper heater 231 and the lower heater 232 being 2:3.

The pull-up unit 24 includes a cable 51 having an end to which a seed crystal 2 is attached and a pull-up driver 52 configured to raise, lower and rotate the cable 51.

At least a surface of the heat shield 25 is formed from a carbon material. The heat shield 25 is provided surrounding the monocrystalline silicon 1 when the monocrystalline silicon 1 is manufactured. The heat shield 25 blocks radiant heat from the dopant-added melt MD stored in the crucible 22, the heater 23 and a side wall of the crucible 22 from reaching the monocrystalline silicon 1 being grown. The heat shield 25 also inhibits outward thermal diffusion from a solid-liquid interface (i.e., an interface where a crystal grows) and a vicinity thereof. Thus, the heat shield 25 controls a temperature gradient of each of a central portion and an outer peripheral portion of the monocrystalline silicon 1 in a pull-up axis direction.

The heat insulation material 26, which is substantially cylindrical, is formed from a carbon material (e.g., graphite). The heat insulation material 26 is disposed outside the heater 23 at a predetermined distance therefrom. The crucible driver 27, which includes a support shaft 53 supporting the crucible 22 from below, rotates, raises and lowers the crucible 22 at a predetermined speed.

The memory 12 stores various information necessary for manufacturing the monocrystalline silicon 1. Examples of the various information include a gas flow rate of Ar gas in the chamber 21, a furnace internal pressure of the chamber 21, electric power supplied to the heater 23, a rotation speed of the crucible 22, a rotation speed of the monocrystalline silicon 1, and a position of the crucible 22. The memory 12 further stores, for instance, a resistivity profile and a pull-up speed profile.

The controller 13 controls each of components on a basis of the various information stored in the memory 12 and a user's operation, thereby manufacturing the monocrystalline silicon 1.

The above-described monocrystalline silicon growth device 10 grows the monocrystalline silicon 1 including a neck 3, a shoulder 4, which gradually increases in diameter, a straight body 5, and a tail (not shown), which gradually decreases in diameter. Specifically, the monocrystalline silicon growth device 10, by bringing the seed crystal 2 into contact with the dopant-added melt MD and then pulling up the seed crystal 2, sequentially grows the neck 3, the shoulder 4, the straight body 5, and the tail.

In FIG. 3, when the dopant supply unit 54 is lowered until the container body is positioned close to the liquid surface of the silicon melt M, the volatile dopant D in the container body 55 is sublimated by radiant heat from the liquid surface of the silicon melt M, so that the container body 55 is filled with the gasified volatile dopant D. When sublimation of the volatile dopant D further proceeds, the gasified volatile dopant D is released through the release tube 56 toward the liquid surface of the silicon melt M. When the gasified volatile dopant D is injected into the surface of the silicon melt M, the silicon melt M is doped with the volatile dopant D to be the dopant-added melt MD (see FIG. 2).

The dopant supply unit does not necessarily have the above configuration. For instance, the dopant supply unit may drop and add a granular volatile dopant into the silicon melt M.

Method of Growing Monocrystalline Silicon

Next, an example of the method of growing monocrystalline silicon according to the exemplary embodiment of the invention is described with reference to a flowchart shown in FIG. 4. The exemplary embodiment shows, as an example, a case where n-type monocrystalline silicon with a product diameter of 200 mm is manufactured. However, the product diameter is not limited thereto.

Further, examples of the volatile dopant to be added include red phosphorus (P), arsenic (As), and antimony (Sb). However, types of the volatile dopant are not limited thereto.

Figure 4:
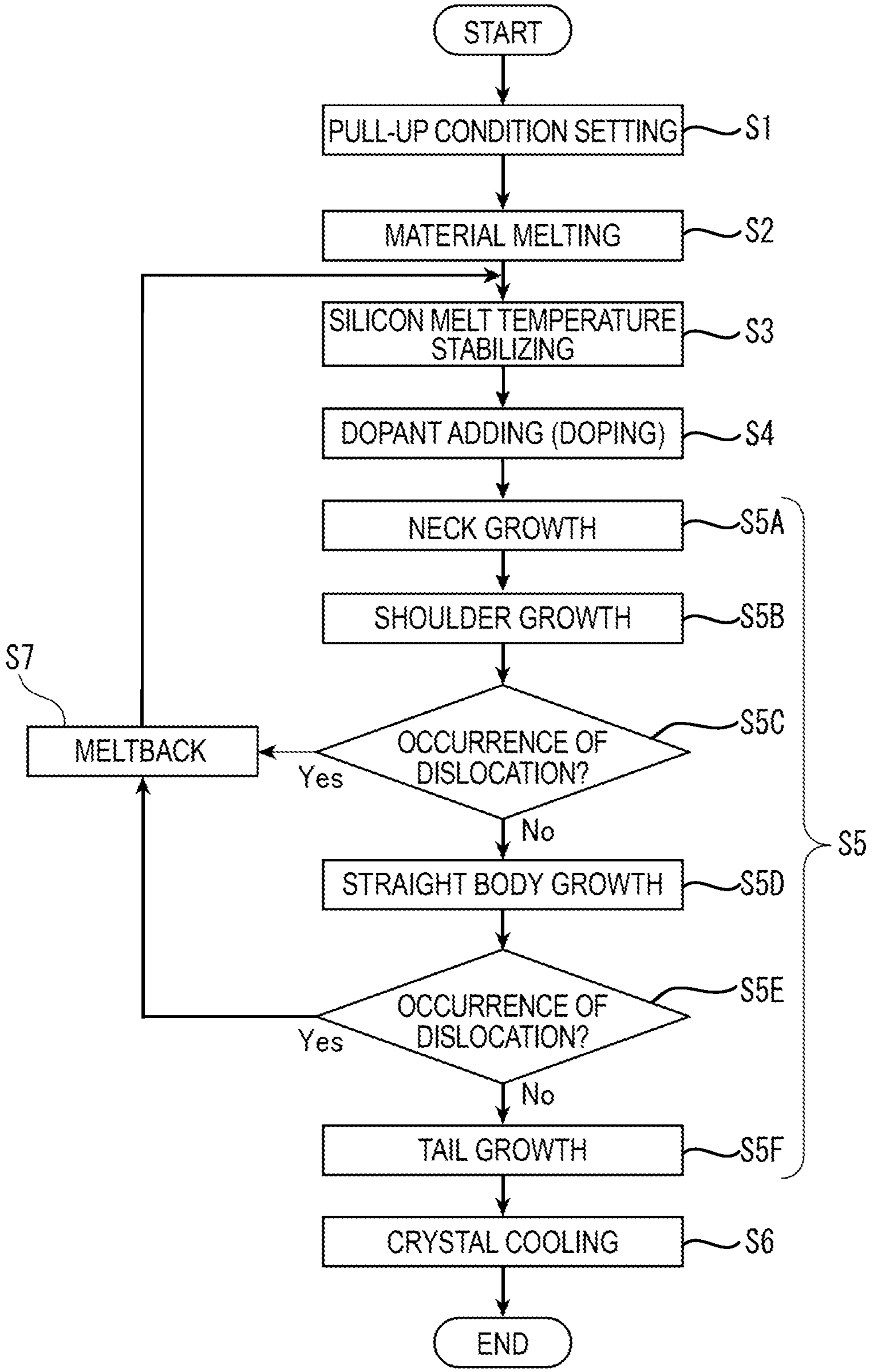
FIG. 4 is a flowchart for explaining the method of growing monocrystalline silicon according to the exemplary embodiment of the invention.

As shown in the flowchart in FIG. 4, the method of growing monocrystalline silicon includes a pull-up condition setting step S1, a material melting step S2, a silicon melt temperature stabilizing step S3, a dopant adding (doping) step S4, a pull-up step S5, and a crystal cooling step S6, which are executed in this order. The pull-up step S5 of pulling up the monocrystalline silicon 1 includes a neck growth step S5A, a shoulder growth step S5B, a first dislocation determining step S5C, a straight body growth step S5D, a second dislocation determining step S5E, and a tail growth step S5F.

The method of growing monocrystalline silicon further includes a meltback step S7 of melting the monocrystalline silicon 1 into the dopant-added melt MD. When it is determined that dislocations occur in the monocrystalline silicon 1 (i.e., the determination is "Yes") in the first dislocation determining step S5C or the second dislocation determining step S5E, the pull-up operation is stopped and the process proceeds to the meltback step S7.

In the method of growing monocrystalline silicon according to the exemplary embodiment, the monocrystalline silicon 1 with a low resistivity is grown by pulling up the monocrystalline silicon 1 from the dopant-added melt MD in which an n-type dopant (e.g., red phosphorus, arsenic, or antimony) is added. A target dopant concentration is also set in this method. The dopant concentration refers to a dopant concentration in the monocrystalline silicon 1. For instance, when red phosphorus is added as the volatile dopant, the dopant concentration is a phosphorus concentration in the monocrystalline silicon 1.

The pull-up condition setting step S1 is a step of setting pull-up conditions such as rotation of the crucible on a basis of, for instance, a target resistivity of the straight body 5 of the monocrystalline silicon 1 and the target dopant concentration in the monocrystalline silicon 1.

The target resistivity of the straight body 5 of the monocrystalline silicon 1 when red phosphorus is used as the volatile dopant can be set in a range from 0.5 mΩ·cm to 1.3 mΩ·cm. The target dopant concentration in the monocrystalline silicon 1 when red phosphorus is used as the volatile dopant can be set in a range from $3.4\times10^{19}$ atoms/$cm^3$ to $1.6\times10^{20}$ atoms/$cm^3$.

The target resistivity of the straight body 5 of the monocrystalline silicon 1 when arsenic is used as the volatile dopant can be set in a range from 1.0 mΩ·cm to ma cm. The target dopant concentration in the monocrystalline silicon 1 when arsenic is used as the volatile dopant can be set in a range from $1.2\times10^{19}$ atoms/$cm^3$ to $7.4\times10^{19}$ atoms/$cm^3$.

The target resistivity of the straight body 5 of the monocrystalline silicon 1 when antimony is used as the volatile dopant can be set in a range from 10.0 mΩ·cm to 30.0 mΩ·cm. The target dopant concentration in the monocrystalline silicon 1 when antimony is used as the volatile dopant can be set in a range from $0.2\times10^{19}$ atoms/$cm^3$ to $0.6\times10^{19}$ atoms/$cm^3$.

The invention is suitable for manufacturing the monocrystalline silicon 1 with an extremely low resistivity as described above. Further, the scope of the invention includes a case where the monocrystalline silicon 1 is manufactured in which the resistivity at a part of the straight body 5 falls within the above-described range of the target resistivity.

A user sets the pull-up conditions such as a pull-up speed on a basis of, for instance, the above-described target resistivity and target dopant concentration, and inputs the pull-up conditions into the controller 13. The controller 13 stores the set pull-up conditions and the like in the memory 12. The controller 13 reads out the pull-up conditions and the like from the memory 12 and executes each step on a basis of the read pull-up conditions and the like.

The material melting step S2 is a step of melting polycrystalline silicon (i.e., a silicon material) contained in the crucible 22 into the silicon melt M. The controller 13 controls a power source (not shown) to supply electric power to the heater 23. By the heater 23 heating the crucible 22, the polycrystalline silicon in the crucible 22 is melted to generate the silicon melt M.

The silicon melt temperature stabilizing step S3 is a step of adjusting a temperature of the silicon melt M to a temperature suitable for growing the monocrystalline silicon 1. In the silicon melt temperature stabilizing step S3, the controller 13 controls an output of the heater 23 so that the temperature of the silicon melt M is a temperature where the seed crystal 2 does not melt when being immersed into the silicon melt M and a crystal does not deposit on the liquid surface of the silicon melt M (e.g., 1412 degrees C.).

At this time, a solidified layer is not formed on the liquid surface of the silicon melt M. The solidified layer is formed by the silicon melt M being solidified. In a case where the solidified layer is formed, doping cannot be performed by being hindered by the solidified layer.

In the silicon melt temperature stabilizing step S3, the controller 13 controls the upper heater 231 and the lower heater 232 of the heater 23 so that a heat generation amount Qd of the lower heater 232 is larger than a heat generation amount Qu of the upper heater 231. In other words, the controller 13 controls the heater 23 so that the heat generation amount Qd of the lower heater>the heat generation amount Qu of the upper heater is satisfied.

A heat generation ratio Qd/Qu, which is obtained by dividing the heat generation amount Qd of the lower heater 232 by the heat generation amount Qu of the upper heater 231, is preferably in a range from 1.5 to 4.0. The heat generation ratio Qd/Qu is more preferably in a range from 3.0 to 3.8.

In the method of growing monocrystalline silicon according to the exemplary embodiment, the heat generation amount Qd of the lower heater 232 is set larger than the heat generation amount Qu of the upper heater 231 so that a lower portion of the silicon melt M is at a higher temperature than an upper portion of the silicon melt M in the silicon melt temperature stabilizing step S3 and the subsequent steps.

A heat generation amount of the heater 23 is equivalent to supplied electric power to the heater 23. That is, the heat generation ratio Qd/Qu is a value obtained by dividing supplied electric power to the lower heater 232 by supplied electric power to the upper heater 231.

The controller 13 controls the heater 23 on a basis of a specification such as a height of the heater 23. That is, even when the height of the upper heater 231 and the height of the lower heater 232 are different from each other, the controller 13 controls electric power supplied to each of the upper heater 231 and the lower heater 232 so that the above heat generation ratio Qd/Qu is satisfied.

The dopant adding step S4 is a step of adding the volatile dopant D to the silicon melt M to prepare the dopant-added melt MD. In the dopant adding step S4, the controller 13 controls the dopant supply unit 54 to directly inject the gasified volatile dopant D into the central portion of the liquid surface of the silicon melt M. It should be noted that the dopant supply unit 54 may inject the gasified volatile dopant D into the entire liquid surface of the silicon melt M.

In the dopant adding step S4, the controller 13 controls the heater 23 so that the heat generation amounts Qu, Qd are similar to those in the silicon melt temperature stabilizing step S3. In other words, the controller 13 controls the heater 23 so that the heat generation amount Qd of the lower heater>the heat generation amount Qu of the upper heater is satisfied. The heat generation ratio Qd/Qu in the dopant adding step S4 is preferably in a range from 1.5 to 4.0, more preferably in a range from 3.0 to 3.8, still more preferably 3.5±0.1.

At a heat generation ratio Qd/Qu of less than 1.5, the temperature of the liquid surface of the silicon melt M is not sufficiently lowered, so that an evaporation amount of the volatile dopant D added to the silicon melt M increases and greatly varies. This disadvantageously causes the resistivity of the monocrystalline silicon to easily deviate from the target resistivity. Meanwhile, at a heat generation ratio Qd/Qu of more than 4.0, for instance, an unintended convection is generated in the silicon melt M to make the temperature of the liquid surface of the silicon melt M inconstant, so that the evaporation amount of the added volatile dopant D cannot be controlled. This also disadvantageously causes the resistivity of the monocrystalline silicon to easily deviate from the target resistivity.

Next, the controller 13 introduces Ar gas at a predetermined flow rate into the chamber 21 through the gas inlet 33A and, by controlling a vacuum pump (not shown), discharges gas present in the chamber 21 through the gas outlet 33B to reduce pressure in the chamber 21, thereby keeping an inside of the chamber 21 in inert atmosphere under reduced pressure.

Then, the controller 13 controls the pull-up driver 52 to lower the cable 51 to dip the seed crystal 2 into the dopant-added melt MD.

Subsequently, the controller 13 controls the crucible driver 27 to rotate the crucible 22 in a predetermined direction and controls the pull-up driver 52 to pull up the cable 51 while rotating the cable 51 in a predetermined direction, thereby growing the monocrystalline silicon 1.

Specifically, the neck 3, the shoulder 4, the straight body 5, and the tail (not shown) are grown in the neck growth step S5A, the shoulder growth step SSB, the straight body growth step S5D, and the tail growth step S5F, respectively.

In the neck growth step S5A, the controller 13 controls the heater 23 so that the heat generation ratio Qd/Qu is substantially the same as that in the dopant adding step S4. Specifically, the heat generation ratio Qd/Qu in the neck growth step S5A is preferably 100±10% of the heat generation ratio Qd/Qu in the dopant adding step S4.

That is, since in the neck growth step S5A, most of the liquid surface of the silicon melt M in the crucible 22 is exposed to increase the evaporation amount of the volatile dopant D, it is preferable to keep the heat generation ratio Qd/Qu in the neck growth step S5A substantially the same as that in the dopant adding step S4 to reduce evaporation of the volatile dopant D.

In the shoulder growth step SSB, the heat generation ratio Qd/Qu can be adjusted on a basis of an oxygen concentration required in the straight body 5 (i.e., an oxygen concentration in the straight body 5). It should be noted that the above-described oxygen concentration is an interstitial oxygen concentration determined according to ASTM F121-1979.

For instance, when the oxygen concentration (i.e., a target oxygen concentration) required in the straight body 5 is $12.0\times10^{17}$ atoms/cm$^3$ or more, the heat generation ratio Qd/Qu is adjusted so that the heat generation ratio Qd/Qu at least at completion of the shoulder growth step S5B is in a range from 3.5 to 4.5, preferably in a range from 3.9 to 4.1.

When the oxygen concentration required in the straight body 5 is less than $12.0\times10^{17}$ atoms/cm$^3$, the heat generation ratio Qd/Qu is adjusted so that the heat generation ratio Qd/Qu at least at the completion of the shoulder growth step S5B is in a range from 0.75 to 1.25, preferably in a range from 0.9 to 1.1.

The reason why the heat generation ratio Qd/Qu in the shoulder growth step S5B is changed depending on the oxygen concentration required in the straight body is that an oxygen concentration in a portion of the straight body 5 close to the shoulder 4 is greatly affected by a temperature of the melt in the crucible in the shoulder growth step S5B. Accordingly, in order to facilitate the oxygen concentration in the portion of the straight body 5 close to the shoulder 4 to fall within a required range of the oxygen concentration, the temperature of the melt is adjusted by changing the heat generation ratio Qd/Qu in the shoulder growth step S5B.

It should be noted that the oxygen concentration in the straight body 5 is adjusted by further adjusting a magnetic field intensity, a rotation speed of the crucible, or the like in the straight body growth step S5D.

In the shoulder growth step SSB, the heat generation ratio Qd/Qu may be simply controlled to be constant by focusing on reducing the evaporation of the volatile dopant D without performing the above-described adjustment based on the oxygen concentration required in the straight body 5. The heat generation ratio Qd/Qu is preferably in a range from 1.0 to 4.0, more preferably in a range from 2.5 to 3.8.

The first dislocation determining step S5C is a step of determining whether dislocations occur in the shoulder 4 of the monocrystalline silicon 1 in or after the shoulder growth step SSB.

When dislocations occur (i.e., the determination is "Yes"), the pull-up step S5 is stopped and the meltback step S7 of melting the monocrystalline silicon 1 into the dopant-added melt MD is executed, resuming the growth process of the monocrystalline silicon 1 from the silicon melt temperature stabilizing step S3. In the meltback step S7, the heat generation ratio Qd/Qu is preferably in a range from 1.5 to 3.0, more preferably in a range from 2.0 to 2.5. When dislocations do not occur (i.e., the determination is "No"), the straight body growth step S5D is executed instead of the meltback step S7.

In the straight body growth step SSD, the controller 13 controls the heater 23 so that the heat generation ratio Qd/Qu is 1, growing the straight body 5. That is, in the straight body growth step SSD, the controller 13 controls the heater 23 so that the output of the upper heater 231 and the output of the lower heater 232 are mutually substantially the same.

In the second dislocation determining step S5C, whether dislocations occur in the straight body 5 of the monocrystalline silicon 1 is determined. When dislocations occur (i.e., the determination is "Yes"), the pull-up step S5 is stopped and the meltback step S7 is executed, resuming the growth process of the monocrystalline silicon 1 from the silicon melt temperature stabilizing step S3. When dislocations do not occur (i.e., the determination is "No"), the tail growth step S5F is executed.

In the tail growth step S5F, the controller 13 controls the heater 23 so that the heat generation ratio Qd/Qu is 1, growing the tail. That is, in the tail growth step S5F, the controller 13 controls the heater 23 so that the output of the upper heater 231 and the output of the lower heater 232 are mutually substantially the same.

Next, the controller 13 controls the pull-up driver 52 to separate the tail of the monocrystalline silicon 1 from the dopant-added melt MD.

In the crystal cooling step S6, the controller 13 controls the pull-up driver 52 to further pull up the cable 51, thereby cooling the monocrystalline silicon 1 separated from the dopant-added melt MD.

Lastly, after it is confirmed that the cooled monocrystalline silicon 1 has been housed in the pull chamber 32, the monocrystalline silicon 1 is taken out of the pull chamber 32.

According to the exemplary embodiment, by setting the output of the lower heater 232 larger than the output of the upper heater 231 in the dopant adding step S4, the temperature of the liquid surface of the silicon melt M when the volatile dopant D is added can be reduced. This enables a lower evaporation rate of the volatile dopant D in the liquid surface to reduce an amount of the volatile dopant D to be added to the silicon melt M.

By reducing evaporation of the volatile dopant D by the above method, the monocrystalline silicon with a low resistivity and with inhibited occurrence of dislocations can be provided as compared with a method in which evaporation of the volatile dopant is reduced by keeping the pressure in the chamber high.

Further, adding the volatile dopant D to the silicon melt M with no solidified layer formed on the liquid surface of the silicon melt M can more reliably perform doping without any hindrance by the solidified layer to the doping.

Furthermore, by using red phosphorus, arsenic or antimony as the volatile dopant D, the n-type monocrystalline silicon 1 with a low resistivity can be grown.

In addition, by setting the heat generation ratio Qd/Qu in the neck growth step S5A to be substantially the same as that in the dopant adding step S4, an adjustment operation of the heat generation ratio in the neck growth step S5A can be eliminated.

Moreover, by adjusting the heat generation ratio Qd/Qu in the shoulder growth step S5B on a basis of the oxygen concentration required in the straight body the oxygen concentration in the straight body 5 can be brought close to the required value.

The method of growing monocrystalline silicon according to the invention is applicable to a method of growing monocrystalline silicon using a so-called multi-pull-up process, in which a plurality of pieces of monocrystalline silicon 1 are pulled up by using the same crucible 22.

The method of growing monocrystalline silicon using the multi-pull-up process includes, after the pull-up step S5 and the crystal cooling step S6, a multi-pull-up step of pulling up another or more pieces of monocrystalline silicon by using the same crucible 22 as the one used in the pull-up step S5.

Prior to the multi-pull-up step, a silicon material for each of the pieces of monocrystalline silicon is supplied to the crucible 22 and heated to obtain a silicon melt, to which the volatile dopant is added. Also in the step of adding the volatile dopant to the silicon melt for each of the pieces of monocrystalline silicon, the heat generation ratio Qd/Qu is preferably in a range from 1.5 to 4.0, more preferably in a range from 3.0 to 3.8, still more preferably 3.5±0.1.

Thus, in the method of growing monocrystalline silicon using the multi-pull-up process, controlling the heat generation ratio Qd/Qu when doping the silicon melt resupplied also enables a lower evaporation rate of the volatile dopant D to reduce the amount of the volatile dopant D to be added to the silicon melt.

EXAMPLE(S)

Example in which the heat generation ratio Qd/Qu from the silicon melt temperature stabilizing step S3 to the shoulder growth step S5B was 3.5 was compared with Comparative in which the heat generation ratio Qd/Qu from the silicon melt temperature stabilizing step S3 to the shoulder growth step S5B was 1.

It should be noted that Example is different from Comparative only in the heat generation ratio Qd/Qu, with other conditions being the same.

Figure 5:
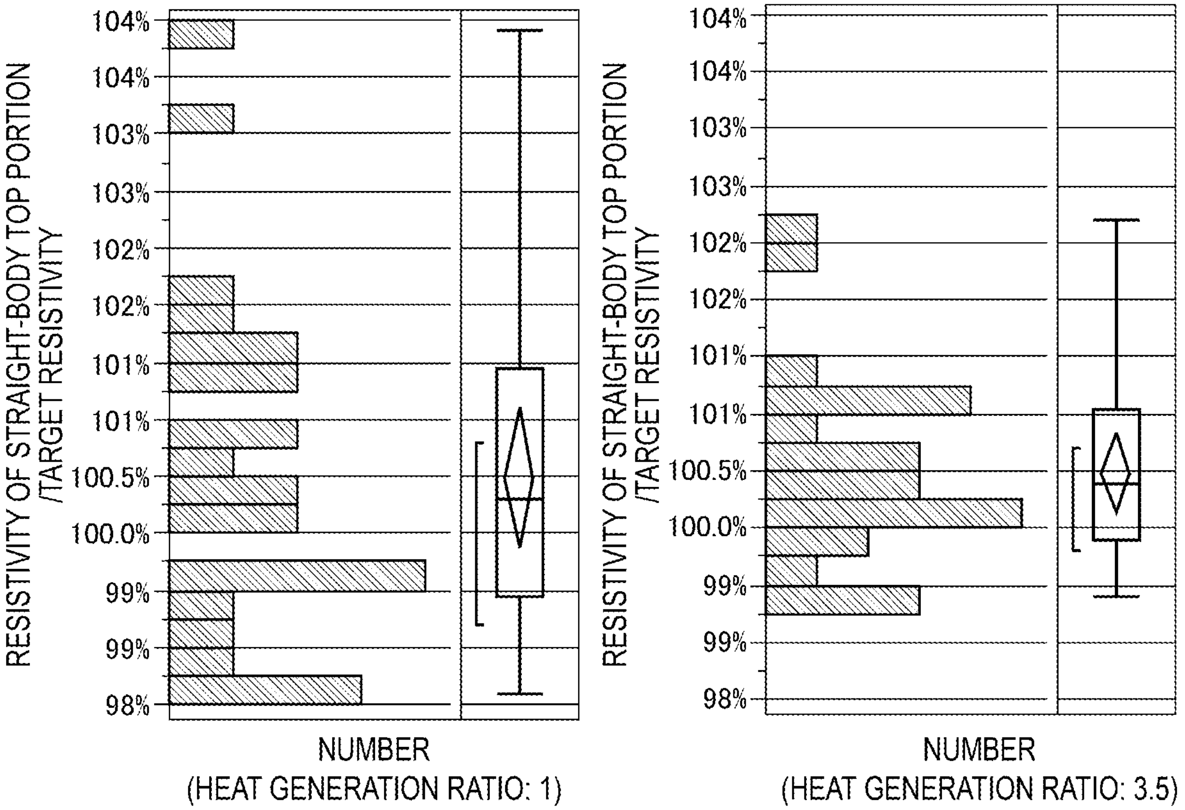
FIG. 5 illustrates graphs each showing a percentage of a resistivity of a straight-body top portion to a target resistivity thereof and also illustrates box plots each showing distribution of data.

FIG. 5 illustrates graphs each showing a percentage of a resistivity of a straight-body top portion to the target resistivity thereof and also illustrates box plots each showing distribution of data. An ordinate axis represents the percentage of the resistivity of the straight-body top portion to the target resistivity thereof. When the resistivity of the straight-body top portion is the same as the target resistivity, the percentage is 100%. An abscissa axis represents a frequency of each percentage of the resistivity of the straight-body top portion to the target resistivity.

As shown in FIG. 5, Example (in which the heat generation ratio was 3.5) had a prominently large frequency of 100% as the percentage of the resistivity of the straight-body top portion to the target resistivity and exhibited a small variation in percentage of the resistivity of the straight-body top portion to the resistivity of the target resistivity, as compared with Comparative (in which the heat generation ratio was 1). That is, by setting the heat generation ratio Qd/Qu to 3.5 in growing the monocrystalline silicon, the evaporation amount of the volatile dopant is less varied, so that a probability of obtaining the target resistivity of a product can be increased.

In the above exemplary embodiment, the heater 23 includes the upper heater 231 and the lower heater 232. However, the arrangement of the heater 23 is not limited thereto. For instance, the heater 23 may be a three-part heater that additionally includes a bottom heater configured to heat a bottom portion of the crucible 22. In this case, the heat generation ratio Qd/Qu is a value obtained by dividing a sum of the heat generation amount of the lower heater and a heat generation amount of the bottom heater by the heat generation amount of the upper heater.

The invention claimed is:

1. A method of growing monocrystalline silicon according to a Czochralski process using a monocrystalline silicon growth device, the method comprising:

before pulling up the monocrystalline silicon with a pull-up unit, heating a crucible disposed within a chamber in a manner that no solidified layer is formed on a liquid surface of a silicon melt in the crucible as well as adding a volatile dopant to the silicon melt, using a dopant supply unit, to obtain a dopant-added melt; and pulling up the monocrystalline silicon with the pull-up unit after bringing a seed crystal into contact with the dopant-added melt;

wherein the heating of the crucible during the adding of the volatile dopant comprises heating an upper portion of the crucible with an upper heater and heating a lower portion of the crucible with a lower heater, and an evaporation rate of the volatile dopant is reduced to greater than 4 g/h and 8 g/h or less by heating the crucible in a manner that a heat generation amount Qd of the lower heater and a heat generation amount Qu of the upper heater satisfy Qd>Qu.

2. The method of growing monocrystalline silicon according to claim 1, wherein the volatile dopant is red phosphorus, arsenic, or antimony.

3. The method of growing monocrystalline silicon according to claim 1, wherein in the adding of the volatile dopant, the crucible is heated in a manner that a heat generation ratio Qd/Qu is in a range from 1.5 to 4.0, the heat generation ratio Qd/Qu being obtained by dividing the heat generation amount Qd of the lower heater by the heat generation amount Qu of the upper heater.

4. The method of growing monocrystalline silicon according to claim 3, wherein the pulling up of the monocrystalline silicon comprises growing a neck, and the heat generation ratio Qd/Qu in the growing of the neck is 100±10% of the heat generation ratio Qd/Qu in the adding of the volatile dopant.

5. The method of growing monocrystalline silicon according to claim 3, wherein the pulling up of the monocrystalline silicon comprises growing a shoulder, in a case where a target oxygen concentration in a straight body of the monocrystalline silicon is $12.0\times10^{17}$ atoms/$cm^3$ or more, the heat generation ratio Qd/Qu at least at completion of the growing of the shoulder is in a range from 3.5 to 4.5, and in a case where the target oxygen concentration in the straight body is less than $12.0\times10^{17}$ atoms/$cm^3$, the heat generation ratio Qd/Qu at least at the completion of the growing of the shoulder is in a range from 0.75 to 1.25.

6. The method of growing monocrystalline silicon according to claim 5, further comprising, in or after the growing of the shoulder, determining first whether a dislocation occurs in the shoulder, wherein in a case where it is determined that the dislocation occurs in the shoulder in the first determining of whether the dislocation occurs, the pull-up operation is stopped and melting the monocrystalline silicon into the silicon melt is executed, and the heat generation ratio Qd/Qu in the melting of the monocrystalline silicon is in a range from 1.5 to 3.0.

7. The method of growing monocrystalline silicon according to claim 3, further comprising, subsequently to the pulling up of the monocrystalline silicon, pulling up another or more pieces of monocrystalline silicon using the crucible unchanged, wherein prior to the pulling up of the another or more pieces of monocrystalline silicon, the volatile dopant is added to a silicon melt for the another or more pieces of monocrystalline silicon, and in the adding of the volatile dopant, the crucible is heated in a manner that the heat generation ratio Qd/Qu is in a range from 1.5 to 4.0.

* * * * *